(12) United States Patent
Strauss et al.

(10) Patent No.: US 12,051,476 B2
(45) Date of Patent: Jul. 30, 2024

(54) TESTING DISRUPTIVE MEMORIES

(71) Applicant: NXP USA, Inc., Austin, TX (US)

(72) Inventors: Timothy Strauss, Granger, IN (US);
Jon Scott Choy, Austin, TX (US);
Michael A. Sadd, Austin, TX (US)

(73) Assignee: NXP USA, Inc., Austin, TX (US)

( * ) Notice: Subject to any disclaimer, the term of this patent is extended or adjusted under 35 U.S.C. 154(b) by 171 days.

(21) Appl. No.: 17/662,862

(22) Filed: May 11, 2022

(65) Prior Publication Data
US 2023/0368859 A1    Nov. 16, 2023

(51) Int. Cl.
| | | |
|---|---|---|
| *G11C 29/46* | (2006.01) | |
| *G11C 29/12* | (2006.01) | |
| *G11C 29/20* | (2006.01) | |
| *G11C 29/36* | (2006.01) | |

(52) U.S. Cl.
CPC .......... *G11C 29/46* (2013.01); *G11C 29/1201* (2013.01); *G11C 29/20* (2013.01); *G11C 29/36* (2013.01); *G11C 2029/3602* (2013.01)

(58) Field of Classification Search
CPC ..... G11C 29/46; G11C 29/1201; G11C 29/20; G11C 29/36; G11C 2029/3602; G11C 7/02; G11C 29/38; G11C 29/44; G11C 29/50
See application file for complete search history.

(56) References Cited

U.S. PATENT DOCUMENTS

| | | | |
|---|---|---|---|
| 5,961,653 A | * | 10/1999 | Kalter ................. G06F 11/2635 714/6.32 |
| 7,168,005 B2 | | 1/2007 | Adams et al. |
| 7,434,131 B2 | | 10/2008 | Mukherjee et al. |
| 8,910,001 B2 | | 12/2014 | Hamdioui et al. |
| 9,384,856 B2 | | 7/2016 | Spruth et al. |
| 10,007,588 B2 | | 6/2018 | Shao et al. |
| 2002/0031026 A1 | * | 3/2002 | Kobayashi ........... G11C 16/344 365/201 |
| 2006/0031726 A1 | | 2/2006 | Zappa et al. |
| 2013/0151912 A1 | * | 6/2013 | Sevugapandian ... G06F 11/1008 714/704 |
| 2017/0147416 A1 | | 5/2017 | Ranjan et al. |

OTHER PUBLICATIONS

Wen, et al., "A flexible logic BIST scheme and its application to SoC designs," Proceedings 10th Asian Test Symposium, Nov. 19-21, 2001, DOI: 10.1109/ATS.2001.990333, Kyoto, Japan, p. 463.

* cited by examiner

*Primary Examiner* — Mohammed A Bashar

(57) ABSTRACT

Memory built-in self-test (MBIST) circuitry for a disruptive memory includes an address sequencer configured to select an address with the disruptive memory as a test location, and control circuitry configured to direct a test sequence including a plurality of test operations on the test location. The control circuitry includes a first fault counter and a second fault counter, in which the control circuitry is configured to, after each test operation of the test sequence, determine whether to selectively update a first fault counter and whether to selectively update a second fault counter. The address sequencer, after completion of the test sequence, selects a next address within the disruptive memory as a next test location.

18 Claims, 6 Drawing Sheets

TESTING DISRUPTIVE MEMORIES

BACKGROUND

Field

This disclosure relates generally to integrated circuits, and more specifically, to Built-In Self Test (BIST) circuitry for testing disruptive memories.

Related Art

Today, Memory Built-in Self Test (MBIST) is a requirement for modern memories to enable efficient testing. However, traditional BIST rely on deterministic operations and strict pass/fail criteria. This is not sufficient for disruptive memory solutions (DMS) such as, for example, magnetoresistive random access memories (MRAMs) or resistive random access memories (RRAMs) because they have non-deterministic behaviors. For example, such memories can exhibit metastability on occasion which are not reliably detected with traditional MBIST. Therefore, a need exists for improved BIST, especially for the case of DMSs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Disruptive memory solutions (DMS) have unique stochastics in their write behavior. Occasionally, they can exhibit a metastable event where it appears that the verify has been fooled into being correct, but in reality, the bit is in transition. Therefore, in one aspect disclosed herein, a flexible MBIST allows for improved testing and screening for errors with respect to metastable conditions. For example, the flexible MBIST enables more complex patterns for observing transitory behavior. In one embodiment, the flexible MBIST utilizes multiple accumulators or counters which can be associated with different read observability points in a particular test pattern sequence for a given address location. For improved coverage, the multiple counters may include multiple counters for each determinate data state (e.g. logic level zero and logic level one) in order to observe faults in both directions (e.g. switching from a logic level zero to a logic level one, and vice versa). The flexible MBIST also allows for configurability to collect faults at certain points in a test sequence of operation using various different counters. For example, a particular counter can be selectively updated based on faults after some but not all read operations of the test sequence. This may involve ignoring certain reads of the sequence. In addition to the creation of test sequences including any combination of read, write, and delay operations, along with the creation of configurable fault collections using multiple counters, the flexible MBIST also allows on the fly timing/level control for reads and writes prior to each operation within a test sequence, in order to better highlight metastability events.

Figure 1:
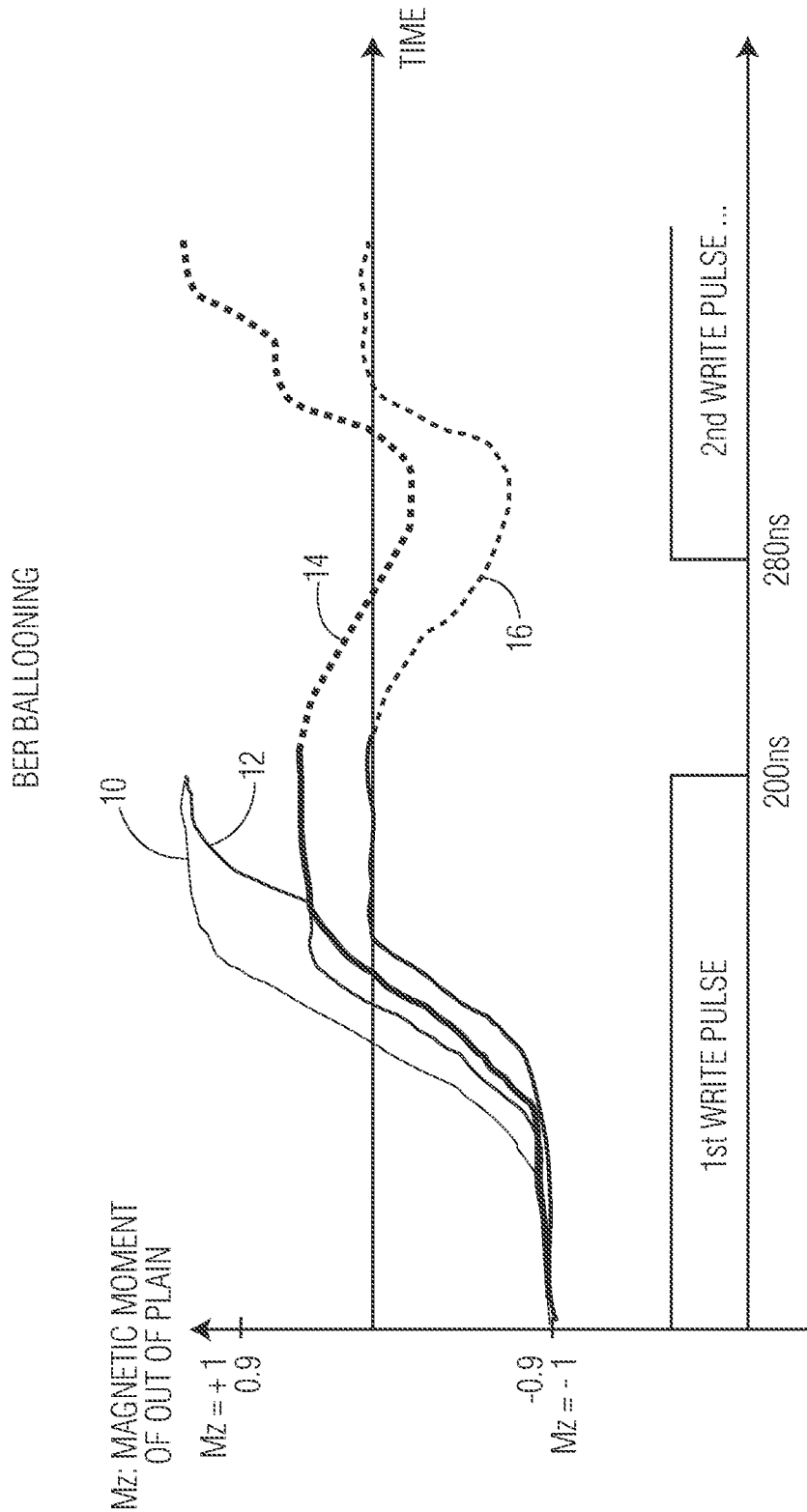
FIG. 1 illustrates various example bit error scenarios which may occur in an MRAM.

Metastability can exhibit itself in various different ways. Metastability causes a bit to be in an indeterminate state, in which it is neither read as a zero or a one. In some situations, the bit may eventually reach a deterministic state, but may require increased time to do so. For example, FIG. 1 illustrates a diagram of bit errors in an MRAM due to metastability events. The vertical axis (y-axis) represents the magnetic moment (Mz) in the out of plane direction for a bit cell, which can vary from −1 to +1 (in which +1 may correspond to the alignment of magnetization between the free magnetic layer and fixed magnetic layer of a bitcell, and −1 to the misalignment of the free and fixed magnetic layers or vice versa). In one example, the determinate states correspond to Mz being greater than 0.9 or less than −0.9 (in which greater than 0.9 may correspond to a logic level one and less than −0.9 to a logic level zero, or vice versa). Also, different thresholds other than 0.9 or −0.9 can be used to identify determinate states. In the illustrated example, when the Mz of the bit is in between 0.9 and −0.9, such as when the bit is attempting to switch from one logic state to the other, the bit is in an indeterminate state. As used herein, each logic state (logic level one and logic level zero) is considered to be a determinate state, while a bit that is in an intermediate state between the logic states is considered to be in an indeterminate state.

In FIG. 1, a first curve 10 (the top curve) corresponds to a good bit in which the bit quickly switches from a first logic state to a second logic state in response to a first (initial) write pulse. A second curve 12 illustrates a bit in a second scenario which successfully switches from the first logic state to the second logic state, but stays for a short while in an intermediate state before snapping up to the second logic state. A third curve 14 illustrates a bit in a third scenario which fails to successfully switch in response to the first pulse and enters an indeterminate state. In this example, the bit eventually snaps to the second logic state in response to a second (subsequent) write pulse. A fourth curve 16 illustrates a failed bit in a fourth scenario in which the bit completely fails to switch to the second logic state and thus remains stuck in the indeterminate state. It may be desirable to detect faults for bits which fall into the second, third, or fourth scenarios, but currently available MBISTs are unable to do so.

Figure 2:
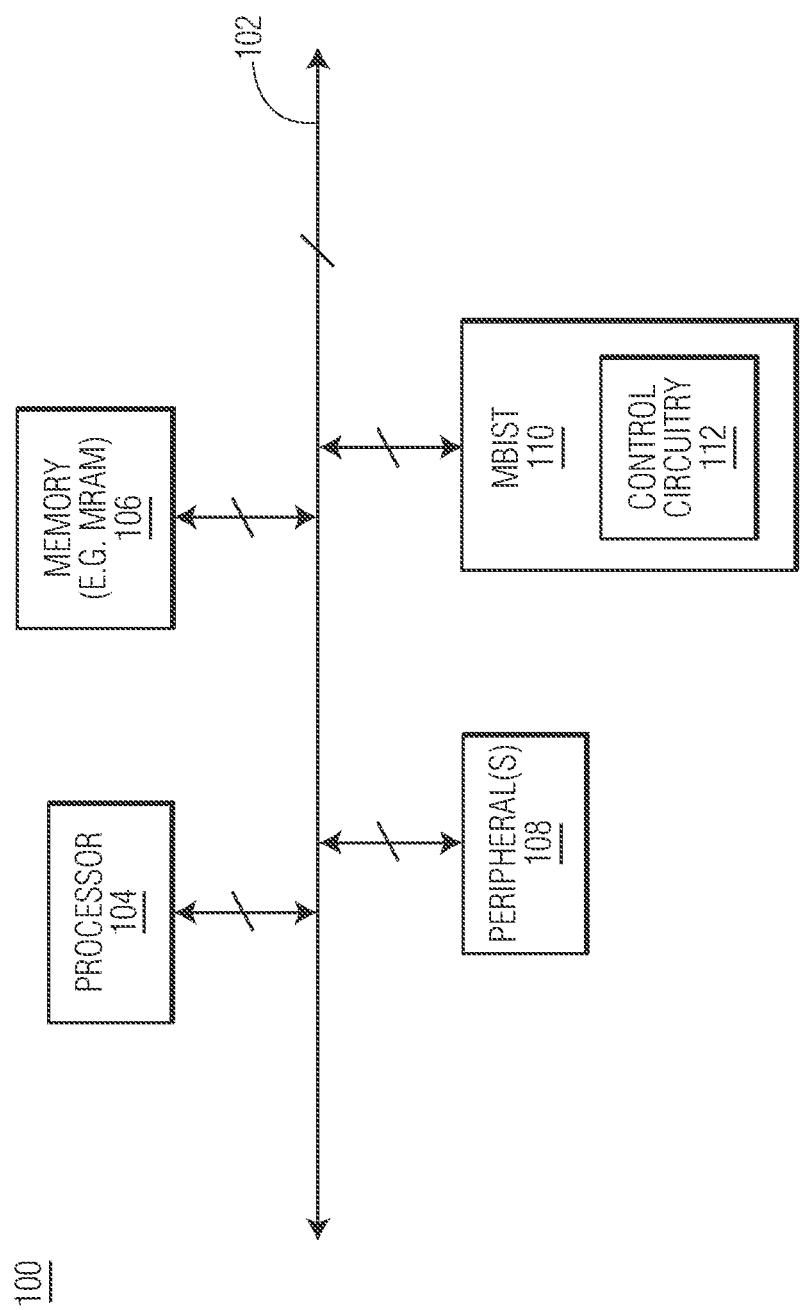
FIG. 2 illustrates, in block diagram form, an integrated circuit having a memory and MBIST circuitry for testing the memory, in accordance with one embodiment of the present invention.

FIG. 2 illustrates an integrated circuit (IC) 100 which includes a processor 104, a memory 106, peripheral(s) 108, MBIST circuitry 110, and a system interconnect 102. In one embodiment, IC 100 may be a system on a chip (SoC) which is integrated onto a single IC. Therefore, IC 100 can also be referred to as a system or an SoC. In one embodiment, memory 106 is a disruptive memory such as an MRAM or RRAM. As an example herein, it will be assumed memory 106 is an MRAM. MBIST circuitry 110 (also referred to as MBIST 110) includes circuitry for testing memory 106. For example, MBIST 110 includes control circuitry 112 which may implement a flexible state machine, as will be described below, to perform sequences of test operations on memory 106. MBIST 110 may also include storage circuitry, as needed, to store the state machine and to store parameter tables, as needed. MBIST 110 can also be located as part of memory 106 or elsewhere within IC 100.

System interconnect 102 can be any type of interconnect, such as, for example, a bus, a cross-bar switch, an interconnect network or fabric, etc. IC 100 may include any number of devices, such as any number of processors, any number of memories (which may include any type of memory, such as non-volatile or volatile memories), and any number of peripherals (or no peripherals at all). Therefore, IC 100 may include more or fewer elements than those illustrated in FIG. 2.

Figure 3:
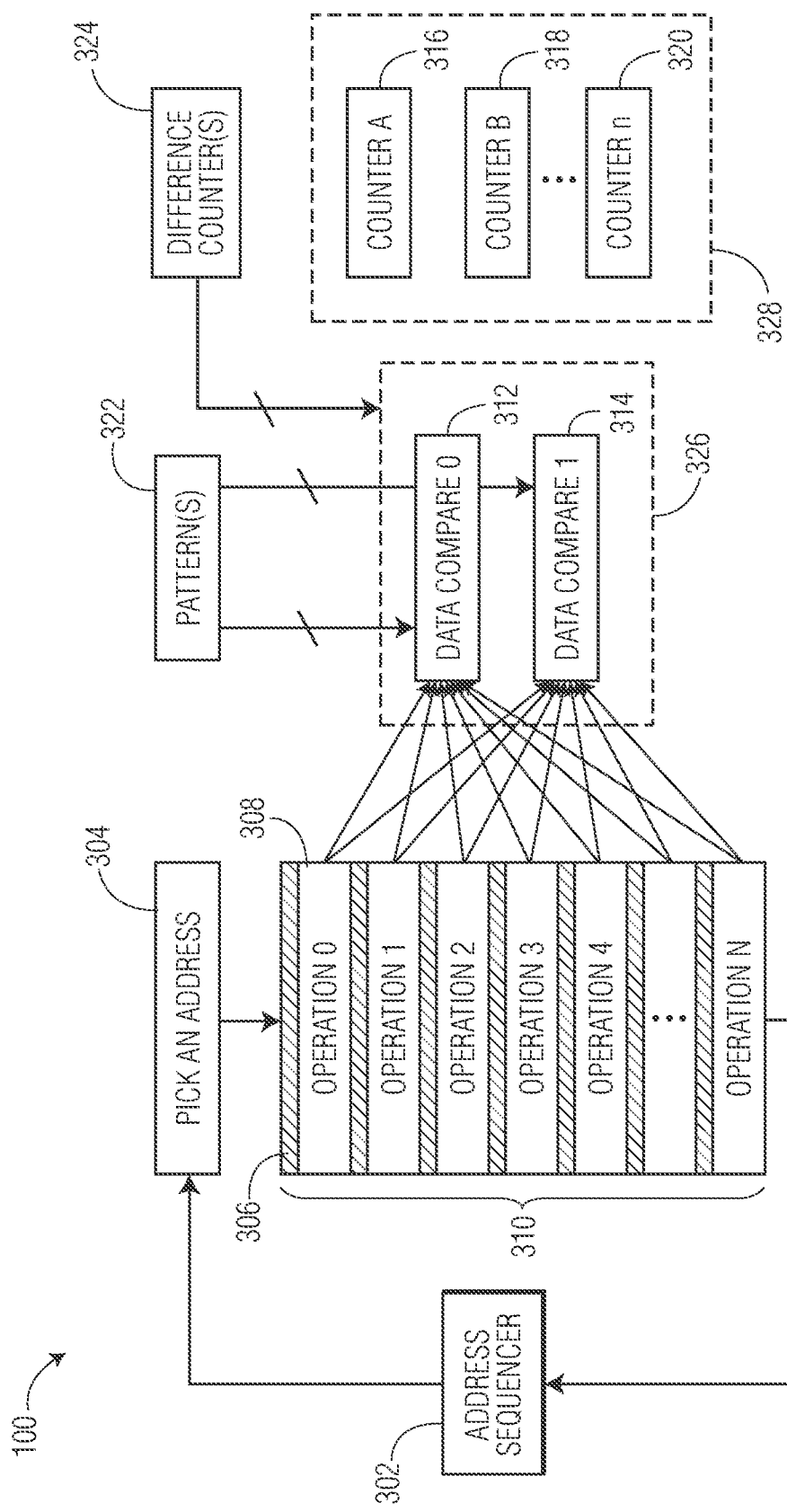
FIG. 3 illustrates, in partial block diagram and partial diagrammatic form, MBIST circuitry of the integrated circuit in accordance with one embodiment of the present invention.

FIG. 3 illustrates a more detailed embodiment of MBIST 110, in which control circuitry 112 includes an address sequencer 302 and implements the address selection of block 304, and directs the test sequence 310 of N+1 operations. MBIST 110 also includes storage circuitry 322 which may store one or more test data patterns, a plurality of comparators 326 (including a first data comparator 0 312 and a second data comparator 1 314), a plurality of counters 328 (including counter A 316, counter B 318, to counter n 320), and a one or more difference counter(s) 324. Each comparator of comparators 326 can access the test data patterns in storage circuitry 322, and difference counter(s) 324 can access any of the comparators in comparators 326. In one embodiment, counters 328 includes at least two counters. Alternate embodiments can include more counters, as will be described below. Note that each counter can be used to count faults, and therefore may be referred to as a fault counter or fault accumulator.

As illustrated in FIG. 3, address sequencer 302 generates test addresses which correspond to address locations of memory 106 to be tested. For example, in one embodiment, address sequencer 302 may generate the test addresses sequentially within memory 106, or may generate them in accordance with any sequence or pattern. A test address is selected in operation 304. (This test address may also be referred to as a test address location or test location.) In one embodiment, this refers to address sequencer 302 providing a next test address on which test sequence 310 of operations will be performed. In the illustrated embodiment, test sequence 310 includes N+1 operations (also referred to as test operations), in which N can be any integer value. Therefore, test sequence 310 includes Operation 0 (Op0)-Operation N (OpN). Each of these operations may include one or more reads, writes, or delays (e.g. no-ops). Test sequence 310 may be implemented by a state machine, as will be described in reference to the example in FIGS. 4 and 5. In one embodiment, N is limited by the maximum number of entries allowed for the state machine Prior to performing each operation, testing parameters can be set for the following operation. For example, with respect to Op0 308, testing parameters can first be set in parameter setting block 306. Therefore, note that each operation has a parameter setting block (illustrated with hashes in FIG. 3) which can be performed prior to performing the operation. These parameters may include, for example, various read parameters for reads, various write parameters for writes, various parameters with respect to the test patterns, and various parameters with respect to fault collection. As will be discussed further below, since each operation in test sequence 310 is performed on the same test address, the same operation can be performed multiple times on the test address at various different points in time during the test sequence to provide improved testing.

While executing the operations of test sequence 310, data comparisons can be done between read data from memory 106 and a stored expected data pattern (in storage circuitry 322) using comparators 314. For each failed comparison, a fault may selectively be counted in any selected counter of counters 328. For example, in one case, a failed comparison upon a switch in logic state in one direction may be accumulated in counter A 316, while a failed comparison upon a switch in the opposite direction may instead be accumulated in counter B 318. Note that each comparator can compare two multibit values, in which the number of bits depends on the length of the read data for each compare. In another case, a failed comparison may be ignored and not counted by any counter of 328. In one embodiment, a difference counter 324 can access comparators 314 to determine which bits of the test location failed. This can be used, for example, to provide additional information regarding detected faults.

Figure 4:
FIG. 4 illustrates, in diagrammatic form, an example operation sequence implemented by the MBIST circuitry.
Figure 5:
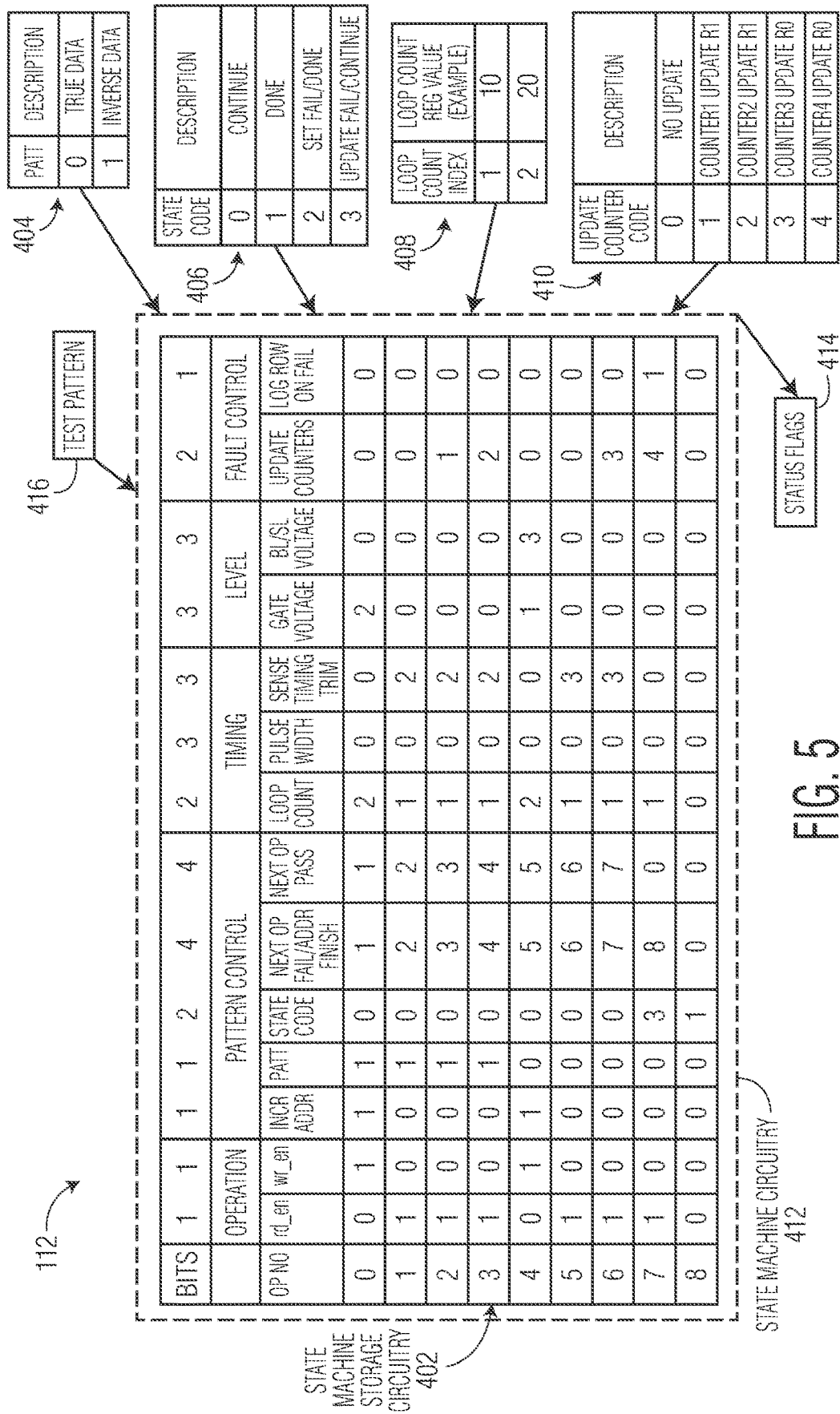
FIG. 5 illustrates, in diagrammatic form, state machine storage circuitry of the MBIST circuitry to implement the example operation sequence of FIG. 4, in accordance with one embodiment of the present invention.

FIGS. 4 and 5 illustrate, in diagrammatic form, an example test sequence 400 (FIG. 4) and the corresponding state machine circuitry (FIG. 5) which implements test sequency 400. FIG. 4 illustrates test sequence 400 which includes 8 operations (Op0-Op7). In this example, the expected test pattern used for writing to a test location, and used for the comparisons against read data, correspond to all zeros. In test sequence 400, a "W0" refers to a write of true data of the test pattern (i.e. the exact test pattern as stored in, e.g., storage circuitry 322) of all zeros to a test location (identified by the test address) and a "W1" refers to a write of inverse data (i.e. the inverse of the test pattern) of all ones to the test location. An "R0" refers to a read from a test location which was previously written with the true data of the test pattern (all zeros), and an "R1" refers to a read form a test location which was previously written with the inverse data of the test pattern (all ones). While in the current embodiment, the test pattern is all zeros in which the true data corresponds to all zeros and the inverse data to all ones, alternate embodiments may use any type of test pattern (with any combination of ones and zeros) in which one or more test patterns can be stored in storage circuitry 322 of FIG. 3. For example, in another embodiment, the test pattern may be alternating zeros and ones, in which the true data is alternating zeros and ones and the inverse data is therefore alternating ones and zeros. In another embodiment, both the true and inverse data of a test pattern can be stored in storage circuitry 322. Also, note that some operations, such as each of Op0 and Op4, include multiple back-to-back writes. Therefore, any operation in a test sequence can include one or more writes (of true or inverse pattern data) or one or more reads (of true or inverse pattern data).

FIG. 5 illustrates state machine circuitry 412 within control circuitry 112, in which state machine circuitry 412 includes state machine storage circuitry 402 configured to store a state machine for defining a test sequence, such as test sequence 400, as well as circuitry used in implementing or executing the state machine (e.g. directing operations of the test sequence defined by the state machine). (Note that any circuitry, as known in the art, may be used to implement the state machine to direct execution of the test sequence.) State machine storage circuitry 402 includes a state machine entry for each operation of test sequence 400. In the illustrated embodiment, state machine storage circuitry 402 includes 9 entries, in which 8 are used to implement Op0-

Op7 of test sequence 400. Note that state machine storage circuitry 402 may simply be referred to as state machine 402, and may include any number of entries available for use in defining a test sequence.

In the illustrated embodiment, each state machine entry represents a corresponding test operation of Op0-Op7 which is defined by various different fields of the entry, including operation type fields, pattern control fields, timing control fields, level control fields, and fault control fields. The operation type fields identify the operation type of the corresponding operation of the entry. This operation type fields includes a one-bit rd_en field and a one-bit wr_en field, in which when the rd_en field stores a logic level one, a read operation is indicated, and when wr_en stores a logic level one, a write operation is indicated. In this example, if neither is set to logic level one, a no-op may be indicated. Note that, as further defined by other fields of the state machine entry, each test operation may include multiple reads or multiple writes.

The pattern control fields define various aspects of the test pattern and the control of the test sequence. The pattern control fields includes a one-bit increment address (inc addr) field, a one-bit pattern (patt) field, a 2-bit state code field, a 4-bit next operation upon fail field, and a 4-bit next operation upon pass field. The addr inc field, if set to one, indicates that the test address is incremented (or otherwise adjusted to indicate a new test location) for the next operation (which corresponds to a next test sequence). If set to zero, then the test sequence continues on the same test location. The pattern control field is identified by a table 404 which indicates that a value of zero for patt indicates that the test pattern is the true data of the test pattern (none of the bits in the test pattern are inverted), and a one for patt indicates that the test pattern is the inverse data of the test pattern (each of the bits is inverted). The test pattern itself can be stored in a data register, such as data register 416 (which may be referred to as test pattern 416 and which may be included as part of storage circuitry 322 described in FIG. 3). The state code field is identified by a table 406 which indicates actions to do in response to passing/failing with the operation of the current entry. For example, a value of zero indicates that the test sequence should continue in accordance with state machine 402 and a value of 3 indicates that a fail flag should be updated (to indicate whether a fail occurred or not) and the test sequence should continue. A value of one for the state code indicates that the test sequence is done and state machine should not be continued (i.e. execution should kick out of the state machine), and a value of 2 indicates that the fail flag should be updated and test sequence is done. The fail flag can be stored in status flags 414, in which status flags may also include additional flags, as needed. Each of the next operation fields (upon fail or upon pass) is provided as the operation number of the next operation in the state machine and thus the next operation in the test sequence. For example, if the next operation is provided as "5", the state machine advances to Op5 in the sixth state machine entry.

The timing control fields define various timing aspects used in either reading from or writing to the test location in memory 106. For example, the timing control fields include a 2-bit loop count field, a 3-bit pulse width field, and a 3-bit sense timing trim field. The loop count field is identified by a table 408 in which a value of one indicates 10 loops counts and a value of two indicates 20 loop counts. The pulse width field may be used to identify the pulse width for writes to the test location. For example, a value of zero may indicate the use of a standard or default pulse width. Similarly, the sense timing trim field may be used to indicate the trim values for trimming control of reads from the test location. The trim values may correspond to the trim values for relative voltages or resistances of the sensing circuitry for performing reads. In one embodiment, a value of zero may indicate the use of standard or default trim values, while greater values may indicate the use of increasingly higher or lower trim values. The level control fields define various voltage levels to use in memory 106 for the reads and writes of the test operations. For example, level control fields include a 3-bit field gate voltage field and a 3-bit bit line/source line (BL/SL) voltage field. The gate voltage field may be used to indicate the gate voltage for reads or writes, and the BL/SL voltage field may be used to indicate the BL or SL voltage levels (or both) for reads or writes. Similarly, a value of zero may correspond to default values, while higher values may indicate increasingly higher or lower voltage values. Therefore, timing control fields and level control fields provides fine grain control of reads and writes of the test operations.

The fault control fields define various aspects of capturing faults during test sequences, to allow for increased flexibility in fault detection. For example, the fault control fields include a 2-bit update counters fields and a one-bit log row on fail bit. The update counters field is defined by a table 410 in which values of 0-4 identify how to selectively update a plurality of counters (e.g. within counters 328 of FIG. 3). In one embodiment, a value of zero indicates that no counters should be updated in response to the corresponding operation of the state machine entry, a value of 1 indicates that a first counter should be updated (e.g. update of counter1 (R1)), a value of 2 indicates that a second counter should be updated (e.g. update of counter2 (R1), a value of 3 indicates that a third counter should be updated (e.g. update of counter3 (R0), and a value of 4 indicates that a fourth counter should be updated (e.g. update of counter4 (R0)). Note that counter1 (R1) and counter3 (R0) are two different counters of counters 328 which may be used to test different transition directions. For example, counter1 (R1) corresponds to performing a read expecting all ones but counts all the zeros which do not match, and counter3 (R0) corresponds to a read which is expecting all zeros but counts all the ones which do not match. Therefore, state machine 402 of FIG. 5 uses four different counters for its updates, but alternatively, a different number of counters may be used (such as two or more counters of counters 328). Note that "updating a counter" as defined in the update counters field corresponds to selectively updating the counter by either counting a fault if the operation failed or not counting a fault if the operation passed. The one-bit log row on fail field indicates whether the corresponding row or test operation is recorded or logged upon a failure that test operation. For example, a value of 0 indicates that the row is not logged upon a failure, while a value of 1 indicates that the row is logged upon the failure.

Each of tables 404, 406, 408, and 410, as well as status flags 414, can be stored in control circuitry 112, or elsewhere within MBIST 110, or elsewhere within IC 100. Similarly, storage 322 for test patterns (including, for example, data register 416) can be in control circuitry 112 or elsewhere within MBIST 110 or IC 100. The tables, status flags, and test patterns need not all be stored in the same location. Note that the organization and size of each field in state machine 402 of FIG. 5 are only provided as examples. Alternate embodiments may use a different number of bits for each field, as needed to index into appropriate lookup tables (such as tables 404, 406, 408, and 410), or in other embodiments, some or all of the fields may store the value directly rather than store an index value for a lookup table. Also, in alternate embodiments, more or fewer fields may be used in each of the pattern control fields, timing control fields, and level control fields depending on which parameters (and what level of control for each parameter) are desired for each test operation. Similarly, the update counters field can be replaced with a field for each counter of counters 328, in which, e.g., each field may be a one-bit field for indicating whether or not to update that particular counter. Also, the values for any of the fields in state machine 402, such as the loop count fields, the level control fields, timing control fields, etc., can be different values than those illustrated in the example of FIG. 5.

Operation of state machine 402 will be described in reference to test sequence 400 of FIG. 4. State machine 402 is all executed on a same selected test address location in memory 106. It is assumed that for this example, test pattern 416 is all zeros. Beginning with Op0 in the first row of state machine 402, the operation type is identified as a write and the patt type is inverse data (therefore, all ones), indicated as W1. The value of the loop count field (i.e. the loop count index) is provided as 2, indicating a loop count of 20 rather than 10, which indicates a number of times to loop the current instruction. Therefore, Op0 includes a first write operation (W1) for 10 loop counts (10 writes to the test location) and a second write operation (W1) for 10 more loop counts (10 more writes to the test location), for a total of 20 loop counts. Each loop of 10 counts is done with a default pulse width, a gate voltage corresponding to the "2" (which may correspond to a higher write voltage level for the gate voltages as compared to a default gate voltage) and BL/SL voltages to "0" (which may correspond to default write voltage values for BL/SL). Therefore, Op0 in test sequence is provided as "W1W1" in FIG. 4, performed in accordance with the write parameters defined in the Op0 entry of the state machine. The state code value (i.e. the state code index) of zero indicates that after completion of the W1W1 operation, operation of state machine continues and advances to the next operation (regardless of whether the operation passes or fails). The next operation is provided as Op1.

The second entry of the state machine defines the next operation, Op1, in test sequence 400. The operation type is identified as a read with inverse data, meaning that a read of all ones (R1) from the test location is expected. The loop count index is a one, meaning the loop count is 10 (the read is performed 10 times). The read parameters are set to those defined in the second entry of the state machine (e.g. the sense timing trim, gate voltage, and SL/BL voltages). At the completion of Op1, a comparator in comparators 326 is used to compare the returned read data with the test pattern of all ones to determine if the operation passed or failed. After Op0 or Op1, note that the update counters index is zero and the log row on fail field is zero, indicating that no counters are updated (i.e. the reads are ignored by the counters) and no fail is logged for that entry or row. The state code indicates that after Op1, the state machine continues with the next operation, provided as Op2.

The third entry of the state machine defines Op2, which is also identified as a read with inverse data (a second R1). For Op2, the read parameters happen to be the same as those for Op1, but they could be set different, if desired. The update counters index is one, though, indicating that, after Op2, counter1 (R1) is updated. For example, this refers to increasing the counter by one only if the comparison between the read data and expected data fails (does not match). Regardless of whether Op2 fails or passes, though, the state machine continues with the next operation, provided as Op3.

The fourth entry defines Op3, which is also identified as a read with inverse data (a third R1), using the same read parameters as for Op1 and Op2. However, the update counters index is two, indicating that, after Op3, counter2 (R1) is updated (a different counter than the one updated after the R1 of Op2). As described above, updating the counter refers to increasing the counter by one only if the comparison between the read data and expected data fails (does not match). Regardless of whether Op3 fails or passes, the state machine continues with the next operation, provided as Op4.

The fifth entry defines Op4, which is identified as a write and the patt type is true data (therefore, all zeros), indicated as W0. The loop count index is provided as 2, indicating a loop count of 20 rather than 10, as with Op0. Therefore, Op4 includes a first write operation (W0) for 10 loop counts (10 writes to the test location) and a second write operation (W0) for 10 more loop counts (10 more writes to the test location), for a total of 20 loop counts. Each loop of 10 counts is done with a default pulse width, as for Op0, but with different gate and BL/SL voltages. The entry of Op4 indicates a gate voltage corresponding to the "1" (which may correspond to a lower write voltage level for the gate voltages as compared to the gate voltage for Op0) and BL/SL voltages to "3" (which may correspond to higher write voltage values for BL/SL as compared to the Bl/SL voltages for Op0). Therefore, Op4 in test sequence 400 is provided as "W0W0" in FIG. 4, performed in accordance with the write parameters defined in the Op4 entry of the state machine, which differs from the write parameters defined for Op0. The state code of 0 indicates that after completion of the W0W0 operation, operation of state machine advances to the next operation, provided as Op5.

The sixth entry defines Op5, which is identified as a read with true data, meaning that a read of all zeros (R0) from the test location is expected. The loop count index is a one, meaning the loop count is 10 (the read is performed 10 times). The read parameters are set to those defined in the sixth entry of the state machine (e.g. the sense timing trim, gate voltage, and SL/BL voltages). At the completion of Op5, a comparator in comparators 326 is used to compare the returned read data with the test pattern of all zeros to determine if the operation passed or failed. This comparator may be the same comparator or different from the one used after Op1. After Op4 and Op5, note that the update counters index is zero and the log row on fail field is zero, indicating that no counters are updated (i.e. the reads are ignored by the counters) and no fail is logged for that entry or row. The state code indicates that after Op5, the state machine continues with the next operation, provided as Op6.

The seventh entry defines Op6, which is also identified as a read with true data (a second R0). For Op6, the read parameters happen to be the same as those for Op5, but they could be set differently, if desired. The update counters index is three, indicating that, after Op6, counter3 (R0) is updated (which is a different counter than the ones updated after Op2 and Op3). Again, this refers to increasing the counter by one only if the comparison between the read data from the R0 read and expected data fails (does not match). Regardless of whether Op6 fails or passes, the state machine continues with the next operation, provided as Op7.

The eight entry defines Op7, which is also identified as a read with true data (a third R0), using the same read parameters as for Op5 and Op6. However, the update counters index is four, indicating that, after Op7, counter4 (R0) is updated (a different counter than the one updated after Op2, Op3, or Op6). As described above, updating the counter refers to increasing the counter by one only if the comparison between the read data and expected data fails (does not match). For Op7, the state code is 3, which indicates that the fail flag is updated (asserted to a one if the comparison between the read data and expected data failed or negated to zero if not) and the state machine continues with the next operation. In the case that the comparison failed, the next operation is Op8 (defined by the ninth entry) in which the state code of 1 for Op8 indicates that the current test sequence is done and the state machine is exited. Also, since the log row on fail field is one, a fail is logged for this entry. In the case that the comparison passed, the next operation is Op0. Since, in the entry for Op7, an increment address is indicated (by the logic level one in an "incr addr" field), the state machine proceeds to Op0 again in which a next test sequence is started at a next test address provided by the address sequencer. (Note that the address can be incremented in accordance with any address pattern used to test memory 106.)

Figure 6:
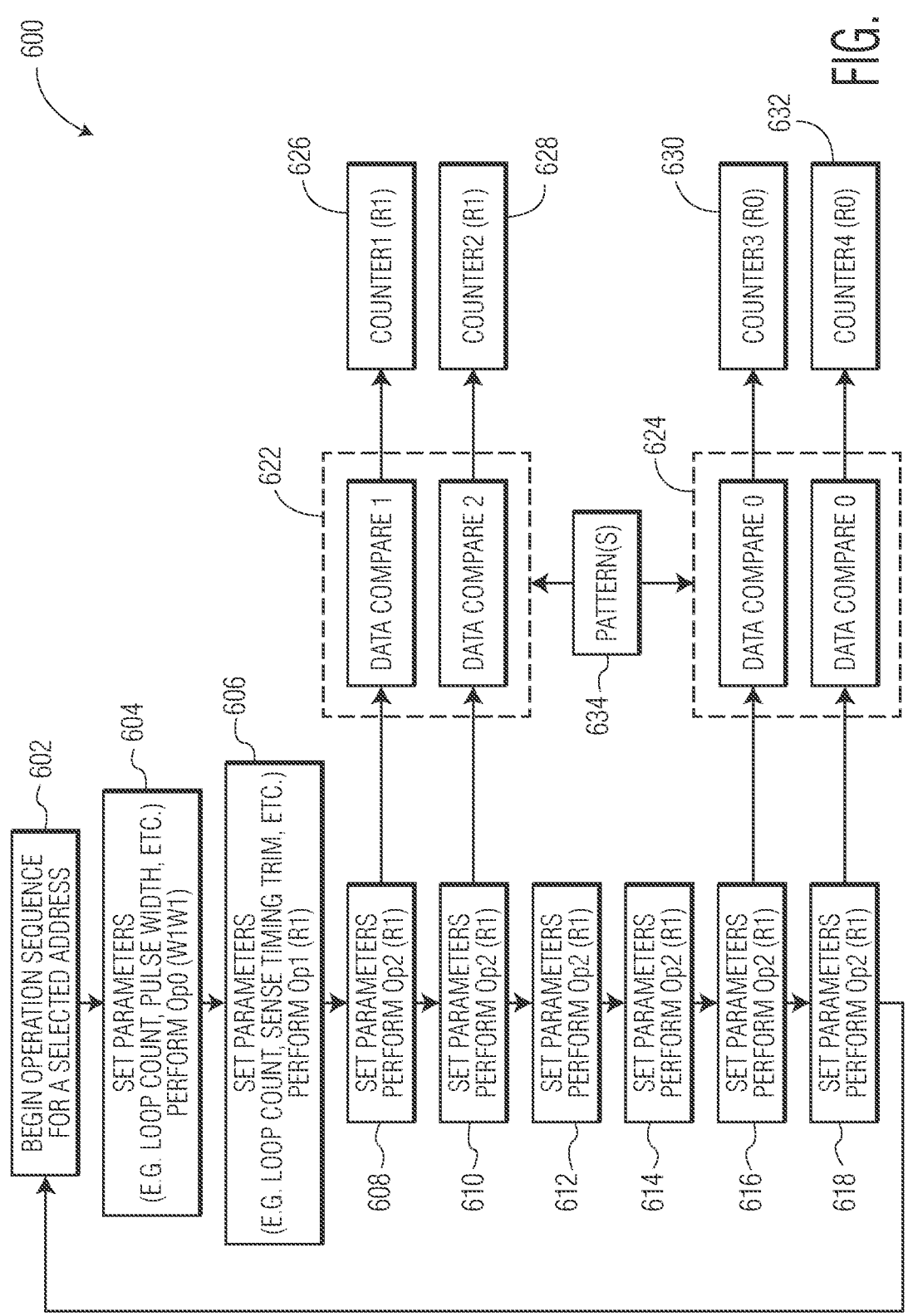
FIG. 6 illustrates, in flow diagram form and block diagram form, a method of implemented the example operation sequence of FIG. 4 by the MBIST circuitry, in accordance with one example of the present invention.

Therefore, a state machine for MBIST 110 can be set up in a variety of different ways to execute a variety of different test sequences. Also, the parameters for each read or write in the test sequence can be dynamically set on the fly prior to performance of each test operation in the test sequence. Setting the parameters may include, for example, providing information to memory 106 to properly set or use the parameters for performing the read or write. FIG. 6 illustrates in partial flow diagram form and partial block diagram form, a method of operating control circuitry 112 to direct test sequence 400 along with a portion 620 of MBIST 110 in accordance with one example of the present invention. Portion 620 includes comparators 622 (data compare 1 and data compare 2), which correspond to comparators 314 of FIG. 3, counters 626, 628, 630, and 632, which correspond to four of the counters of counters 328 of FIG. 3, and test data pattern(s) 634, which corresponds to test data pattern(s) 322 of FIG. 3. In one embodiment, control circuitry 112 directs test sequence 400 with the use of a state machine, as illustrated in FIG. 5. However, in alternate embodiments, control circuitry 112 can be implemented with other circuitry, other than by using a state machine, to direct test sequences, such as test sequence 400. Furthermore, in these alternate embodiments, storage circuitry, such as, e.g., a set of registers, can be used to define parameters for each operation of a test sequence to store the control information analogous to that information stored in the control fields of each state machine entry of FIG. 5. (This storage circuitry can be located within control circuitry 112 or elsewhere within MBIST 110.) Therefore, it is to be understood that a state machine is just an exemplary implementation of control circuitry 112.

Method 600 begins the operation sequence (e.g. test sequence 400) for a first selected address of memory 106 (referred to as a test address or test location), in which all of operations 604-616 are performed on this selected test address. After selecting the test address, the parameters for Op0 are set (in block 604) in accordance with the control fields provided in state machine 402 for Op0, as was described above in reference to FIGS. 4 and 5. After the parameters are set, Op0 is performed (corresponding to performing back to back writes of all ones, W1W1, to the test address). The parameters which are set for Op0 may include the loop count, pulse width, etc., or any other parameters defined in the entries of the state machine which affect a write operation Next, in block 606, the parameters for Op1 are set in accordance with the control fields provided in state machine 402 for Op1, and after the parameters are set, Op1 is performed (corresponding to a first read from the test address, R1). The parameters which are set for Op1 may include loop count, sense timing trim, etc., or any other parameters defined in the entries of the state machine which affect a read operation. Recall that the loop count provides how many times each read or write is performed for the corresponding operation. Note that for R1 of Op1, as described above, no counters are updated.

Next, in block 608, the parameters for Op2 are set, and then Op2 is performed (corresponding to a second read R1 from the test address, at a later time than the first R1). Upon performing R1 for Op2, the read data is compared to the expected data pattern (all ones) by data compare 1 of comparators 622. (The expected data pattern can be provided, for example, by pattern(s) 634.) Based on the result of this comparison, counter1 (R1) 626 is selectively updated. For example, if a mismatch occurs, then a failure is indicated and counter1 (R1) is incremented. If a match occurs, the counter remains at the same value. Next, in block 610, the parameters for Op3 are set, and then Op3 is performed (corresponding to a third read R1 from the test address, at a later time that the second R1). Upon performing R1 for Op3, the read address is compared to the expected data pattern (all ones) by data compare 1, and based on the result of this comparison, counter2 (R1) is selectively updated.

Next, in block 612, the parameters for Op4 are set, and Op4 (W0W0) is performed. Next, in block 614, the parameters for Op5 are set, and Op5 (the first R0) is performed. Next, in block 616, the parameters for Op6 (the second R0) are set, and then Op6 is performed (in which the second R0 is performed at a later time than the first R0). Upon performing R0 for Op6, the read data is compared to the expected data pattern (all zeros) by data compare 2 of comparators 622. (This expected data pattern can also be provided by pattern(s) 634.) Based on the result of this comparison, counter2 (R0) is selectively updated. Next, in block 618, the parameters for Op7 (the third R0) are set, and then Op7 is performed (in which the third R0 is performed at a later time than the second R0). Upon performing R0 for Op7, the read data is compared to the expected data pattern by data compare 2, and based on the result of this comparison, counter4 (R0) is selectively updated. Upon completion of Op7, the state machine has finished performing test sequence 400 and method 600 returns to block 602 to begin a next operation sequence defined by the state machine for a next selected test address.

Therefore, with the use of a state machine, such as state machine 402, it is possible, for a particular address location in memory 106, to perform a write operation and subsequently perform multiple read operations to obtain multiple results on the particular address location, but at different times and tracked with different fault accumulators. With the use of different counters in counters 328 to accumulate faults for these read operations, two different fault results can be obtained which differ in time. Furthermore, as illustrated in FIG. 3, a difference counter 324 can be used to provide further information between comparators, in which a counter can be used to accumulate faults resulting from mismatches as well as provide information as to which bits failed (mismatched). For example, data compare 0, on a first read, may indicate a fault which can be accumulated by a first counter in which bits 2 and 6 mismatched with the expected read data, and data compare 1, on a second read from the same test address location, may also indicate a fault which can be accumulated by a second counter but in which bits 1 and 7 mismatched instead. This highlights the issues with not just timing of the reads, but with particular bit lanes.

As indicated above in FIG. 1, it is possible for metastability events to cause different bit behaviors in DMSs. Therefore, performing an immediate read after a write to determine if an address location passed or fail is not sufficient in light of metastability events. For example, there are instances where a first read of the address location may pass, but a delayed read of the same address location may fail, or the opposite may occur in which the first read fails but the delayed read passes. The use of multiple separate counters combined with the flexibility of test sequences created with the flexible state machine allows for improved observability of faults. In contrast, currently available MBISTs which provide a pass/fail result based on a strict pass condition, without temporal qualifiers and using only one fault accumulator, may incorrectly assess a fault or incorrectly miss a fault.

By now it should be appreciated that there has been provided an improved MBIST which is capable of producing various different test sequences in which faults on a particular test location can be determined and accumulated with different fault accumulators and at different times. Also, for each test sequence performed on a same test location, parameters for each test operation in the test sequence can be set or changed prior to performance of the test operation, which provides improved flexibility. With these testing parameters, in addition to changing read and write parameters, a test sequence can be generated in which some test operations (e.g. some reads of the test sequence) may result in selectively updating a selected fault accumulator, while other test operations (e.g. other reads of the same test sequence) are not used to selectively updated any fault accumulators (such that those reads are ignored). In this manner, flexible conditions can be applied and changed during a test sequence and flexible statistic gathering can be implemented in order to achieve improved fault coverage, particularly in light of metastable events.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. Also for example, in one embodiment, the illustrated elements of system 100 are circuitry located on a single integrated circuit or within a same device. Alternatively, system 100 may include any number of separate integrated circuits or separate devices interconnected with each other. For example, memory 106 may be located on a same integrated circuit as processor 104 or on a separate integrated circuit. Some or all of peripherals 108 may also be located on separate integrated circuits or devices.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different control fields in the state machine entries may be used to modify different sets of parameters before each operation of a test sequence. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a system includes a disruptive memory, and memory built-in self-test (MBIST) circuitry. The MBIST circuitry includes an address sequencer configured to select an address within the disruptive memory as a test location, and control circuitry configured to direct a test sequence including a plurality of test operations on the test location. The control circuitry includes a first fault counter and a second fault counter, in which the control circuitry is configured to, after each test operation of the test sequence, determine whether to selectively update a first fault counter and whether to selectively update a second fault counter. The address sequencer is configured to, after completion of the test sequence, select a next address within the disruptive memory as a next test location. In one aspect of this embodiment, the test sequence includes a first read operation from the test location to obtain first read data and a second read operation from the test location at a subsequent point in time to obtain second read data. In a further aspect, the control circuitry is configured to selectively update the first fault counter in response to a comparison between expected read data and the first read data, and selectively update the second fault counter in response to a comparison between expected read data and the second read data obtained at subsequent point in time. In yet a further aspect, the expected data is the same for the first read data and the second read data. In another aspect of the above embodiment, the MBIST includes storage circuitry configured to store corresponding fault control indicators for each test operation of the test sequence. In a further aspect, the control circuitry includes a plurality of fault counters, including the first and second fault counters, and the corresponding fault control indicators for each test operation include an indication to not update any of the plurality of fault counters or indicates a selected fault counter of the plurality of fault counters to selectively update in response to the test operation. In yet a further aspect, the MBIST circuitry includes storage circuitry configured to store a corresponding plurality of parameters for each test operation of the test sequence, wherein the control circuitry is configured to apply the corresponding parameters prior to each test operation of the test sequence. In yet a further aspect, each test operation includes one or more reads from the test location or one or more writes to the test location. In yet an even further aspect, the corresponding plurality of parameters for each test operation includes a loop count which indicates how many times to repeat reads or writes of the test operation, a pulse width indicator which indicates a pulse width to use when the test operation includes one or more writes, and a sense timing trim indicator which indicates trim values to use when the test operation includes one or more reads. In another yet further aspect, the corresponding plurality of parameters for each test operation includes a gate voltage indicator which indicates a gate voltage to use when performing the test operation and a source line/bit line voltage indicator which indicates source line/bit line voltages to use when performing the test operation. In another aspect of the above embodiment, each test operation is a read operation which includes one or more reads from the test location, a write operation which includes one or more writes to the test location, or a delay operation. In a further aspect, the control circuitry is configured to apply a set of test parameters having first values prior to performing a first operation of the test sequence, and apply the second set of test parameters having second values prior to performing a second operation of the test sequence, in which the first values for the set of test parameters are different from the second values. In a further aspect, the control circuitry includes a state machine configured to direct the test sequence.

In another embodiment, a system includes a disruptive memory and memory built-in self-test (MBIST) circuitry. The MBIST circuitry includes a plurality of fault counters, control circuitry configured to implement a state machine which directs a test sequence on a selected test location of the disruptive memory, and state machine storage circuitry having a plurality of state machine entries configured to store the state machine, each state machine entry defining a corresponding test operation of the test sequence, each state machine entry having a corresponding fault counter field and corresponding one or more parameter control fields for the corresponding test operation. The corresponding fault counter field includes an indication to not update any of the plurality of fault counters in response to the corresponding test operation or indicates a selected fault counter of the plurality of fault counters to selectively update based on a result of the corresponding test operation. In one aspect of the another embodiment, when the corresponding fault counter field of a state machine entry of the plurality of state machine entries indicates a corresponding selected fault counter of the plurality of fault counters to selectively update, the corresponding selected fault counter is incremented when the corresponding test operation defined by the state machine entry is performed and fails, and is not updated when the corresponding test operation defined by the state machine entry is performed and passes. In a further aspect, the corresponding test operation defined by the state machine entry is a read operation, and the read operation fails when the read data for the read operation does not match expected read data and passes when the read data for the read operation matches the expected read data. In another aspect of the another embodiment, at least two state machine entries of the plurality of state machine entries define read operations of the test sequence to read from the selected test location but at different points of time during execution of the test sequence, and the at least two state machine entries identify different fault counters of the plurality of fault counters to selectively update. In another aspect, each test operation defined by the state machine is a read operation which includes one or more reads from the test location, a write operation which includes one or more writes to the test location, or a delay operation. In a further aspect, the corresponding one or more parameter control fields for each corresponding test operation include read parameters which are applied in the disruptive memory for each read operation of the test sequence or write parameters which are applied in the disruptive memory for each write operation of the test sequence.

In yet another embodiment, a method of testing a disruptive memory includes initiating a test sequence in which the test sequence includes a plurality of operations performed on a same address location in the disruptive memory and the plurality of operations includes a first read operation and a subsequent second read operation. The method also includes performing the first read operation to obtain first read data from the same address location, comparing the first read data with expected read data and selectively updating a first fault counter based on results of the comparing, at a subsequent point in time after performing the first read operation, performing the second read operation to obtain second read data from the same address location, comparing the second read data with expected read data and selectively updating a second fault counter, different from the first fault counter, based on results of the comparing, completing the plurality of operations on the test sequence, and selecting a next address location in the disruptive memory and initiating a second test sequence in which the second test sequence includes a second plurality of operations performed on the next address location.

What is claimed is:

1. A system, comprising:
    a disruptive memory; and
    memory built-in self-test (MBIST) circuitry, comprising:
        an address sequencer configured to select an address within the disruptive memory as a test location;
        control circuitry configured to direct a test sequence including a plurality of test operations on the test location, the control circuitry comprising a plurality of fault counters, including:
            a first fault counter; and
            a second fault counter, wherein the control circuitry is configured to, after each test operation of the test sequence, determine whether to selectively update the first fault counter and whether to selectively update the second fault counter; and
        storage circuitry configured to store corresponding fault control indicators for each test operation of the test sequence, wherein the corresponding fault control indicators for each test operation include an indication to not update any of the plurality of fault counters or indicates a selected fault counter of the plurality of fault counters to selectively update in response to the test operation,
    wherein the address sequencer is configured to, after completion of the test sequence, select a next address within the disruptive memory as a next test location.

2. The system of claim 1, wherein the test sequence includes a first read operation from the test location to obtain first read data and a second read operation from the test location at a subsequent point in time to obtain second read data.

3. The system of claim 2, wherein the control circuitry is configured to:
    selectively update the first fault counter in response to a comparison between expected read data and the first read data, and
    selectively update the second fault counter in response to a comparison between expected read data and the second read data obtained at subsequent point in time.

4. The system of claim 3, wherein the expected data is the same for the first read data and the second read data.

5. The system of claim 1, wherein storage circuitry is further configured to store a corresponding plurality of parameters for each test operation of the test sequence, wherein the control circuitry is configured to apply the corresponding parameters prior to each test operation of the test sequence.

6. The system of claim 5, wherein each test operation includes one or more reads from the test location or one or more writes to the test location.

7. The system of claim 6, wherein the corresponding plurality of parameters for each test operation includes a loop count which indicates how many times to repeat reads or writes of the test operation, a pulse width indicator which indicates a pulse width to use when the test operation includes one or more writes, and a sense timing trim indicator which indicates trim values to use when the test operation includes one or more reads.

8. The system of claim 6, wherein the corresponding plurality of parameters for each test operation includes a gate voltage indicator which indicates a gate voltage to use when performing the test operation and a source line/bit line voltage indicator which indicates source line/bit line voltages to use when performing the test operation.

9. The system of claim 1, wherein each test operation is a read operation which includes one or more reads from the test location, a write operation which includes one or more writes to the test location, or a delay operation.

10. The system of claim 9, wherein the control circuitry is configured to:
    apply a set of test parameters having first values prior to performing a first operation of the test sequence; and
    apply the set of test parameters having second values prior to performing a second operation of the test sequence, wherein the first values for the set of test parameters are different from the second values.

11. The system of claim 10, wherein the control circuitry comprises a state machine configured to direct the test sequence.

12. A system, comprising:
    a disruptive memory; and
    memory built-in self-test (MBIST) circuitry, comprising:
        a plurality of fault counters;
        control circuitry configured to implement a state machine which directs a test sequence on a selected test location of the disruptive memory;
        state machine storage circuitry having a plurality of state machine entries configured to store the state machine, each state machine entry defining a corresponding test operation of the test sequence, each state machine entry having a corresponding fault counter field and corresponding one or more parameter control fields for the corresponding test operation, wherein:
            the corresponding fault counter field includes an indication to not update any of the plurality of fault counters in response to the corresponding test operation or indicates a selected fault counter of the plurality of fault counters to selectively update based on a result of the corresponding test operation.

13. The system of claim 12, wherein when the corresponding fault counter field of a state machine entry of the plurality of state machine entries indicates a corresponding selected fault counter of the plurality of fault counters to selectively update, the corresponding selected fault counter is incremented when the corresponding test operation defined by the state machine entry is performed and fails, and is not updated when the corresponding test operation defined by the state machine entry is performed and passes.

14. The system of claim 13, wherein the corresponding test operation defined by the state machine entry is a read operation, and the read operation fails when the read data for the read operation does not match expected read data and passes when the read data for the read operation matches the expected read data.

15. The system of claim 12, wherein at least two state machine entries of the plurality of state machine entries define read operations of the test sequence to read from the selected test location but at different points of time during execution of the test sequence, and the at least two state machine entries identify different fault counters of the plurality of fault counters to selectively update.

16. The system of claim 12, wherein each test operation defined by the state machine is a read operation which includes one or more reads from the test location, a write operation which includes one or more writes to the test location, or a delay operation.

17. The system of claim 16, wherein the corresponding one or more parameter control fields for each corresponding test operation include read parameters which are applied in the disruptive memory for each read operation of the test sequence or write parameters which are applied in the disruptive memory for each write operation of the test sequence.

18. A method of testing a disruptive memory, comprising:
initiating a test sequence, wherein the test sequence includes a plurality of operations performed on a same address location in the disruptive memory, the plurality of operations including a first read operation and a subsequent second read operation;
applying a first set of read parameter values for read parameters, wherein the read parameters include at least one of a sense timing trim indicator which indicates trim values, a gate voltage indicator which indicates a gate voltage, and a source line/bit line voltage indicator which indicates source line/bit line voltages to use when performing a first read operation;
performing the first read operation to obtain first read data from the same address location;
comparing the first read data with expected read data and selectively updating a first fault counter based on results of the comparing;
at a subsequent point in time after performing the first read operation, applying a second set of read parameter values for the read parameters, different from the first set of read parameter values, to use when performing a second read operation, and performing the second read operation to obtain second read data from the same address location;
comparing the second read data with expected read data and selectively updating a second fault counter, different from the first fault counter, based on results of the comparing;
completing the plurality of operations on the test sequence; and
selecting a next address location in the disruptive memory and initiating a second test sequence, wherein the second test sequence includes a second plurality of operations performed on the next address location.

* * * * *